United States Patent
Sun

(10) Patent No.: US 6,810,886 B2
(45) Date of Patent: Nov. 2, 2004

(54) CHAMBER CLEANING VIA RAPID THERMAL PROCESS DURING A CLEANING PERIOD

(75) Inventor: Sheng Sun, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 169 days.

(21) Appl. No.: 09/866,225

(22) Filed: May 24, 2001

(65) Prior Publication Data

US 2003/0029473 A1 Feb. 13, 2003

(51) Int. Cl.[7] .................................................. B08B 7/04
(52) U.S. Cl. ........................................ 134/1.1; 134/19
(58) Field of Search .............................. 134/1, 1.1, 19, 134/22.18, 22.19, 30, 37, 22.1; 438/905

(56) References Cited

U.S. PATENT DOCUMENTS

| | | | | |
|---|---|---|---|---|
| 5,158,644 A | * | 10/1992 | Cheung et al. | 438/694 |
| 5,616,208 A | * | 4/1997 | Lee | 156/345.24 |
| 5,709,757 A | * | 1/1998 | Hatano et al. | 134/22.14 |
| 5,785,796 A | * | 7/1998 | Lee | 156/345.24 |
| 5,843,239 A | * | 12/1998 | Shrotriya | 134/1.1 |
| 5,849,092 A | * | 12/1998 | Xi et al. | 134/1.1 |
| 5,983,906 A | * | 11/1999 | Zhao et al. | 134/1.1 |
| 6,039,834 A | * | 3/2000 | Tanaka et al. | 156/345.36 |
| 6,236,023 B1 | * | 5/2001 | Savas et al. | 219/390 |

* cited by examiner

*Primary Examiner*—Alexander Markoff
(74) *Attorney, Agent, or Firm*—Moser, Patterson & Sheridan, LLP

(57) ABSTRACT

A method for cleaning a process chamber, comprising the steps of introducing at least one cleaning gas to the process chamber; and employing a rapid heating module located in the process chamber, wherein the rapid heating module increases the temperature of chamber parts and improves the surface temperature uniformity of chamber parts when the module is turned on, thereby assisting the cleaning activity of the cleaning gas such that the process chamber is cleaned.

20 Claims, 2 Drawing Sheets

CHAMBER CLEANING VIA RAPID THERMAL PROCESS DURING A CLEANING PERIOD

BACKGROUND OF THE INVENTION

1. Field of the Invention

The present invention relates generally to the field of semiconductor manufacturing. More specifically, the present invention relates to an improved chamber cleaning method via a rapid thermal process during the cleaning period.

2. Description of the Related Art

An important way to improve quality and overall efficiency in fabricating devices is to clean the chamber effectively and economically. During processing, reactive gases released inside the process chamber form layers such as silicon oxides or nitrides on the surface of a substrate being processed. Undesirable deposition occurs elsewhere in the process apparatus, such as in the area between the gas mixing box and gas distribution manifold. Undesired residues also may be deposited in or around the exhaust channel, the liners and walls of the process chamber during such processes. Over time, failure to clean the residue from the process apparatus often results in degraded, unreliable processes and defective substrates. Without frequent cleaning procedures, impurities from the residue built-up in the process apparatus can migrate onto the substrate. The problem of impurities causing damage to the devices on the substrate is of particular concern with today's increasingly small device dimensions. Thus, process system maintenance is important for the smooth operation of substrate processing, as well as resulting in improved device yield and better product performance.

Frequently, periodic chamber cleaning between processing of every N substrates is desired to improve process system performance in producing high quality devices. Providing an efficient, non-damaging clean of the chamber and/or substrate often is able to enhance performance and quality of the devices produced. Two methods of cleaning a process chamber in the art are in-situ cleaning (also known as dry-etch cleaning) and wet cleaning.

In an in-situ cleaning operation, process gases are evacuated from the process chamber and one or more cleaning gases are introduced. Energy is then applied to promote a reaction between the gases and any residues which may have accumulated on the process chamber's interior surfaces. Those residues react with the cleaning gases, forming gaseous by-products which are then exhausted from the process chamber, along with non-reacted portions of the cleaning gases. The cleaning process is followed by the resumption of normal wafer processing.

In contrast to an in-situ cleaning procedure, in which the process chamber remains sealed, a wet cleaning procedure is performed by breaking the process chamber's vacuum seal and manually wiping down the chamber's interior surfaces. A wet cleaning procedure is normally performed to remove residues which are not entirely removed by the in-situ cleaning process, and thus slowly accumulate over time. A solvent is sometimes used to dissolve these residues. Once cleaned, the process chamber is sealed and normal processing is resumed.

Unfortunately, such cleaning operations affect a substrate processing system's throughput in a variety of ways. For example, system throughput is reduced by the time involved in performing cleaning operations. In an in-situ cleaning process, time is spent evacuating process gases from, and introducing/evacuating the cleaning gases into/from the process chamber. Flow rates, plasma power levels, temperature, pressure, and other cleaning process conditions must also be reset to desired levels after the cleaning process is completed. When a wet clean is performed, opening the process chamber and physically wiping the chamber's interior surfaces results in even more downtime because the process must subsequently be re-stabilized. It is thus desirable to reduce the frequency with which such cleaning operations are performed.

Additionally, frequent cleaning operations tend to increase wear on the process chamber components. For example, in-situ cleaning is typically performed using fluoridated carbons (e.g., $CF_4$, $C_2$ or $F_6$) or similar fluorine-containing gases (e.g., $NF_3$) due to their highly reactive nature. Unfortunately, exposure to plasmas created from such gases often causes the deterioration of process chamber components. This increased wear can lead to component failure; thereby causing extended downtime, and adversely affecting processing system throughput.

The use of reactive gases in cleaning process chambers, however, also suffers from a further disadvantage. The same radicals that provide desirable cleaning characteristics may themselves cause the formation of residues. For example, the use of such gases can cause the accumulation of polymer residues, which also exhibit undesirable qualities. The addition of oxygen to the cleaning process gas may reduce the formation of such polymer residues. In particular, ozone or an oxygen/ozone mixture may provide the desired reduction in polymer formation while speeding the cleaning process, due to ozone's greater reactivity.

Another example of residues generated by cleaning gases is the cleaning residues often formed by the use of fluoridated compounds in certain cleaning processes. These compounds may react with the aluminum or anodized aluminum which makes up many of the standard process chamber's components to form an aluminum fluoride residue on the interior surfaces of the chamber and the chamber's components. The reaction between the aluminum and the fluorine-containing compounds often occurs because the residues within the process chamber vary in thickness and therefore have different cleaning times. Thus, certain areas of the process chamber's interior may become residue-free (i.e., exposed) before others, resulting in the formation of an aluminum fluoride residue on the exposed portions of the chamber's interior.

Therefore, the prior art is deficient in the lack of effective means of cleaning a process chamber in chemical vapor deposition (CVD) or etching processes. In particular, the cleaning means should be capable of removing the residues created during substrate processing operations, while reducing or eliminating the subsequent formation of cleaning residues such as polymers and aluminum fluoride. Specifically, the prior art is deficient in the lack of effective means of chamber cleaning via rapid thermal process during the cleaning period. The present invention fulfills these long-standing needs and desires in the art.

SUMMARY OF THE INVENTION

In one embodiment of the present invention there is provided a method for cleaning a process chamber, comprising the steps of introducing at least one cleaning gas to the process chamber; and employing a rapid heating module located in the process chamber, wherein the rapid heating module increases the temperature of chamber parts and improves the surface temperature uniformity of chamber parts when the module is turned on, thereby assisting the cleaning activity of the cleaning gas such that the process chamber is cleaned.

In one embodiment of the present invention there is provided a method for cleaning a process chamber, comprising the steps of introducing at least one halogen-containing gas to the process chamber; and employing a rapid heating module located in the process chamber, wherein the rapid heating module comprises a high power lamp assembly, a resistive heater assembly, an inductive heater assembly, or a combination of two or more of the assemblies, wherein the rapid heating module increases the temperature of chamber parts and improves the surface temperature uniformity of chamber parts when the module is turned on, thereby assisting the cleaning activity of the cleaning gas such that the process chamber is cleaned.

In one embodiment of the present invention there is provided a method for cleaning a process chamber, comprising the steps of introducing at least one fluorine-containing gas to the process chamber; and employing a rapid heating module located in the process chamber, wherein the rapid heating module comprises a high power lamp assembly placed at the bottom of the process chamber, a resistive heater assembly or an inductive heater assembly embedded in the chamber wall next to the liners, or a combination of two or more of the assemblies, wherein the rapid heating module increases the temperature of chamber parts and improves the surface temperature uniformity of chamber parts when the module is turned on, thereby assisting the cleaning activity of the cleaning gas such that the process chamber is cleaned.

In another embodiment of the present invention there is provided a method for cleaning a process chamber, comprising the steps of introducing at least one precursor gas to the process chamber; applying a plasma to the precursor gas in the process chamber, wherein the plasma activates the precursor gas to generate reactive species; and employing a rapid heating module located in the process chamber, wherein the rapid heating module increases the temperature of chamber parts and improves the surface temperature uniformity of chamber parts when the module is turned on, thereby assisting the cleaning activity of the reactive species such that the process chamber is cleaned.

In another embodiment of the present invention there is provided a method for cleaning a process chamber, comprising the steps of introducing at least one halogen-containing gas to the process chamber; applying a plasma to the halogen-containing gas in the process chamber, wherein the plasma activates the halogen-containing gas to generate reactive species; and employing a rapid heating module located in the process chamber, wherein the rapid heating module comprises a high power lamp assembly, a resistive heater assembly, an inductive heater assembly, or a combination of two or more of the assemblies, wherein the rapid heating module increases the temperature of chamber parts and improves the surface temperature uniformity of chamber parts when the module is turned on, thereby assisting the cleaning activity of the reactive species such that the process chamber is cleaned.

In another embodiment of the present invention there is provided a method for cleaning a process chamber, comprising the steps of introducing at least one fluorine-containing gas to the process chamber; applying a plasma to the fluorine-containing gas in the process chamber, wherein the plasma activates the fluorine-containing gas to generate reactive species; and employing a rapid heating module located in the process chamber, wherein the rapid heating module comprises a high power lamp assembly placed at the bottom of the process chamber, a resistive heater assembly or an inductive heater assembly embedded in the chamber wall next to the liners, or a combination of two or more of the assemblies, wherein the rapid heating module increases the temperature of chamber parts and improves the surface temperature uniformity of chamber parts when the module is turned on, thereby assisting the cleaning activity of the reactive species such that the process chamber is cleaned.

In yet another embodiment of the present invention there is provided a method for cleaning a process chamber, comprising the steps of introducing at least one precursor gas to a remote chamber, wherein the remote chamber is connected to the interior of the process chamber; applying a plasma to the precursor gas in the remote chamber wherein the plasma activates the precursor gas to generate reactive species; introducing the reactive species to the process chamber; and employing a rapid heating module located in the process chamber, wherein the rapid heating module increases the temperature of chamber parts and improves the surface temperature uniformity of chamber parts when the module is turned on, thereby assisting the cleaning activity of the reactive species such that the process chamber is cleaned.

In yet another embodiment of the present invention there is provided a method for cleaning a process chamber, comprising the steps of introducing at least one halogen-containing gas to a remote chamber, wherein the remote chamber is connected to the interior of the process chamber; applying a plasma to the halogen-containing gas in the remote chamber wherein the plasma activates the halogen-containing gas to generate reactive species; introducing the reactive species to the process chamber; and employing a rapid heating module located in the process chamber, wherein the rapid heating module comprises a high power lamp assembly, a resistive heater assembly, an inductive heater assembly, or a combination of two or more of the assemblies, wherein the rapid heating module increases the temperature of chamber parts and improves the surface temperature uniformity of chamber parts when the module is turned on, thereby assisting the cleaning activity of the reactive species such that the process chamber is cleaned.

In yet another embodiment of the present invention there is provided a method for cleaning a process chamber, comprising the steps of introducing at least one fluorine-containing gas to a remote chamber, wherein the remote chamber is connected to the interior of the process chamber; applying a plasma to the fluorine-containing gas in the remote chamber wherein the plasma activates the fluorine-containing gas to generate reactive species; introducing the reactive species to the process chamber; and employing a rapid heating module located in the process chamber, wherein the rapid heating module comprises a high power lamp assembly placed at the bottom of the process chamber, a resistive heater assembly or an inductive heater assembly embedded in the chamber wall next to the liners, or a combination of two or more of the assemblies, wherein the rapid heating module increases the temperature of chamber parts and improves the surface temperature uniformity of chamber parts when the module is turned on, thereby assisting the cleaning activity of the reactive species such that the process chamber is cleaned.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

DETAILED DESCRIPTION OF THE INVENTION

Figure 1:
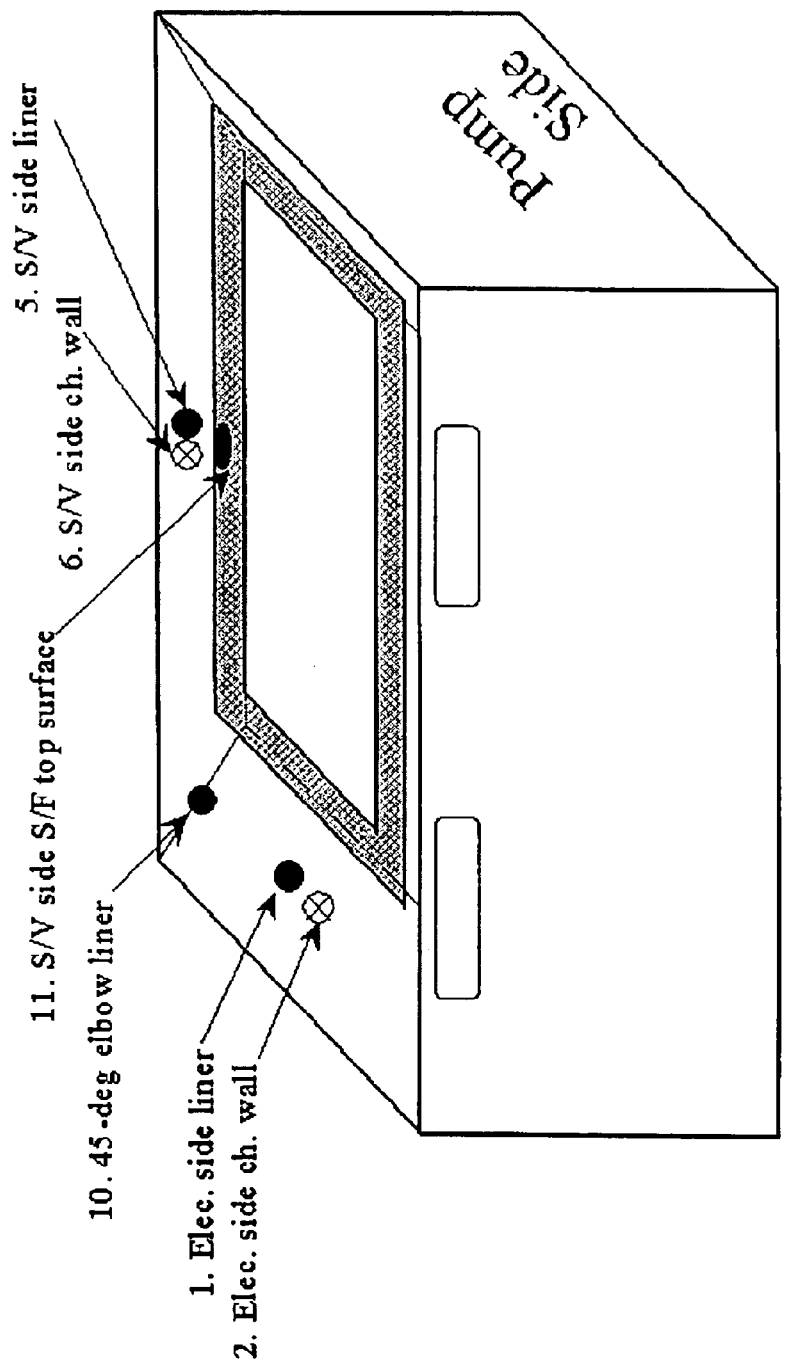
FIG. 1 shows an AKT CVD-5500 chamber wall and liner temperature measurement. One eighth inch thick ceramic spacers were added between the liners and wall. Heat transfer and liner temperature was studied.

In one embodiment of the present invention there is provided a method for cleaning a process chamber, comprising the steps of introducing at least one cleaning gas to the process chamber; and employing a rapid heating module located in the process chamber, wherein the rapid heating module increases the temperature of chamber parts and improves the surface temperature uniformity of chamber parts when the module is turned on, thereby assisting the cleaning activity of the cleaning gas such that the process chamber is cleaned.

Specifically, the cleaning gas may be a fluorine-containing gas, a chlorine-containing gas or a halogen-containing gas. Representative examples of fluorine-containing gas include HF, $F_2$, $NF_3$, $SF_6$, $C_2F_6$, $CF_4$, and $C_3F_8$. The rapid heating module may be a high power lamp assembly placed at the bottom of the chamber, a resistive heater or an inductive heater assembly embedded in the chamber wall next to the liner, or a combination of any two or three. The process chamber may be a CVD or etch chamber.

In one embodiment of the present invention there is provided a method for cleaning a process chamber, comprising the steps of introducing at least one cleaning gas to the process chamber; and employing a rapid heating module located in the process chamber, wherein the rapid heating module comprises a high power lamp assembly, a resistive heater assembly, an inductive heater assembly, or a combination of two or more of the assemblies, wherein the rapid heating module increases the temperature of chamber parts and improves the surface temperature uniformity of chamber parts when the module is turned on, thereby assisting the cleaning activity of the cleaning gas such that the process chamber is cleaned. Specifically, the halogen-containing gas may be a fluorine-containing gas or a chlorine-containing gas. Representative examples of the fluorine-containing gas include HF, $F_2$, $NF_3$, $SF_6$, $C_2F_6$, $CF_4$, and $C_3F_8$. The process chamber may be a CVD or etch chamber.

In one embodiment of the present invention there is provided a method for cleaning a process chamber, comprising the steps of introducing at least one cleaning gas to the process chamber; and employing a rapid heating module located in the process chamber, wherein the rapid heating module comprises a high power lamp assembly placed at the bottom of the process chamber, a resistive heater assembly or an inductive heater assembly embedded in the chamber wall next to the liners, or a combination of two or more of the assemblies, wherein the rapid heating module increases the temperature of chamber parts and improves the surface temperature uniformity of chamber parts when the module is turned on, thereby assisting the cleaning activity of the cleaning gas such that the process chamber is cleaned. Representative examples of the fluorine-containing gas and the process chamber are as disclosed supra.

In another embodiment of the present invention there is provided a method for cleaning a process chamber, comprising the steps of introducing at least one precursor gas to the process chamber; applying a plasma to the precursor gas in the process chamber, wherein the plasma activates the precursor gas to generate reactive species; and employing a rapid heating module located in the process chamber, wherein the rapid heating module increases the temperature of chamber parts and improves the surface temperature uniformity of chamber parts when the module is turned on, thereby assisting the cleaning activity of the reactive species such that the process chamber is cleaned. The precursor gas may be the same as disclosed supra. The rapid heating module may comprise those assemblies and optionally in those combinations also disclosed supra. The process chamber may be a CVD or etch chamber.

In another embodiment of the present invention there is provided a method for cleaning a process chamber, comprising the steps of introducing at least one halogen-containing gas to the process chamber; applying a plasma to the halogen-containing gas in the process chamber, wherein the plasma activates the halogen-containing gas to generate reactive species; and employing a rapid heating module located in the process chamber, wherein the rapid heating module comprises a high power lamp assembly, a resistive heater assembly, an inductive heater assembly, or a combination of two or more of the assemblies, wherein the rapid heating module increases the temperature of chamber parts and improves the surface temperature uniformity of chamber parts when the module is turned on, thereby assisting the cleaning activity of the reactive species such that the process chamber is cleaned. Representative examples of the halogen-containing gas and the process chamber are as disclosed supra. The rapid heating module may be located as disclosed supra.

In another embodiment of the present invention there is provided a method for cleaning a process chamber, comprising the steps of introducing at least one fluorine-containing gas to the process chamber; applying a plasma to the fluorine-containing gas in the process chamber, wherein the plasma activates the fluorine-containing gas to generate reactive species; and employing a rapid heating module located in the process chamber, wherein the rapid heating module comprises a high power lamp assembly placed at the bottom of the process chamber, a resistive heater assembly or an inductive heater assembly embedded in the chamber wall next to the liners, or a combination of two or more of the assemblies, wherein the rapid heating module increases the temperature of chamber parts and improves the surface temperature uniformity of chamber parts when the module is turned on, thereby assisting the cleaning activity of the reactive species such that the process chamber is cleaned. Representative examples of the fluorine-containing gas and the process chamber are as disclosed supra.

In yet another embodiment of the present invention there is provided a method for cleaning a process chamber, comprising the steps of introducing at least one precursor gas to a remote chamber, wherein the remote chamber is connected to the interior of the process chamber; applying a plasma to the precursor gas in the remote chamber wherein the plasma activates the precursor gas to generate reactive species; introducing the reactive species to the process chamber; and employing a rapid heating module located in the process chamber, wherein the rapid heating module increases the temperature of chamber parts and improves the surface temperature uniformity of chamber parts when the module is turned on, thereby assisting the cleaning activity of the reactive species such that the process chamber is cleaned. The precursor gas may be the same as the gases disclosed supra. The rapid heating module may comprise those assemblies and optionally in those combinations also disclosed supra. The process chamber may be a CVD or etch chamber.

In yet another embodiment of the present invention there is provided a method for cleaning a process chamber, comprising the steps of introducing at least one halogen-containing gas to a remote chamber, wherein the remote chamber is connected to the interior of the process chamber; applying a plasma to the halogen-containing gas in the remote chamber wherein the plasma activates the halogen-containing gas to generate reactive species; introducing the reactive species to the process chamber; and employing a rapid heating module located in the process chamber, wherein the rapid heating module comprises a high power lamp assembly, a resistive heater assembly, an inductive heater assembly, or a combination of two or more of the assemblies, wherein the rapid heating module increases the temperature of chamber parts and improves the surface temperature uniformity of chamber parts when the module is turned on, thereby assisting the cleaning activity of the reactive species such that the process chamber is cleaned. Representative examples of the halogen-containing gas and the process chamber are as disclosed supra. The rapid heating module may be located as disclosed supra.

In yet another embodiment of the present invention there is provided a method for cleaning a process chamber, comprising the steps of introducing at least one fluorine-containing gas to a remote chamber, wherein the remote chamber is connected to the interior of the process chamber; applying a plasma to the fluorine-containing gas in the remote chamber wherein the plasma activates the fluorine-containing gas to generate reactive species; introducing the reactive species to the process chamber; and employing a rapid heating module located in the process chamber, wherein the rapid heating module comprises a high power lamp assembly placed at the bottom of the process chamber, a resistive heater assembly or an inductive heater assembly embedded in the chamber wall next to the liners, or a combination of two or more of the assemblies, wherein the rapid heating module increases the temperature of chamber parts and improves the surface temperature uniformity of chamber parts when the module is turned on, thereby assisting the cleaning activity of the reactive species such that the process chamber is cleaned. Representative examples of the fluorine-containing gas and the process chamber are as disclosed supra.

Provided herein is a method for cleaning a process chamber by employing a rapid thermal process (RTP) module to quickly increase the chamber parts temperature during the process chamber cleaning period. In AKT plasma enhanced chemical vapor deposition (PECVD) systems, the deposition process temperature is optimized to be around 300° C. for the large-size glass substrates. Therefore, the process chamber is designed to achieve this temperature (Tsub) with the best substrate temperature uniformity. However, due to the single active heater source, the susceptor, and different heat transfer mechanisms, the chamber parts, especially those exposed to the deposition plasma, exhibit a strong surface temperature variation as shown in FIG. 1.

An RTP module, either a high power lamp or embedded resistive heating system, can be employed during the chamber cleaning period to quickly increase the chamber parts' temperature and achieve a better surface temperature uniformity among all parts exposed to the deposition plasma. Since the film dry etch rate increases with the surface temperature, such rapid heating method will increase the cleaning rate significantly and reduce the consumption of cleaning gases.

Table 1 shows a typical relationship of clean rate vs. surface temperature. The data were obtained in an actual AKT CVD-3500 chamber. The film etch rate was calculated using the formula:

Etch rate=(the final thickness−the initial thickness)/etch time.

TABLE 1

| Film Type | Tsusc (° C.) | Approx. Tsub (° C.) | Etch Rate (A/min) |
|---|---|---|---|
| SiN | 120/130 | 90 | 18448 |
|  | 180/190 | 150 | 19224 |
|  | 240/250 | 200 | 21036 |
| α-Si | 120/130 | 90 | 23100 |
|  | 180/190 | 150 | 26172 |
|  | 240/250 | 200 | 29370 |
| SiO | 120/130 | 90 | 976 |
|  | 180/190 | 150 | 1144 |
|  | 240/250 | 200 | 1842 |

Tsusc: susceptor set temperature (inner heater/outer heater combination);
Approx. Tsub: the estimated substrate surface temperature.

This RTP module can be applied with either in-situ plasma cleaning process or the remote plasma source cleaning (RPSC) process. This methodology can be expanded easily by a person having ordinary skill in this art to other semiconductor processes in the cleaning of CVD or etch chambers.

The following examples are given for the purpose of illustrating various embodiments of the invention and are not meant to limit the present invention in any fashion.

EXAMPLE 1

Chamber Wall and Liner Temperature Measurement

In AKT CVD-5500 chamber system, ⅛" thick ceramic spacers were added between the liners and chamber wall to study heat transfer and liner temperature (FIG. 1). Eleven thermocouples (TCs) were installed, six of which survived (i.e., TC1, TC2, TC5, TC6, TC10 and TC11). The six surviving TCs were Kepton-taped to different places on the chamber wall, liners and shadow frame (for substrate clamping purpose).

TC1 was attached to the middle of the left-side liner, while TC2 was placed underneath on the chamber wall. Similarly, TC5 was attached to the middle of the slit valve side liner, while TC6 was embedded underneath on the chamber wall. TC10 was placed on the corner elbow-shaped liner, while TC11 was laid on the shadow frame top surface.

All the temperature readings were recorded at different process conditions though the susceptor temperature was maintained at 350/360° C. for inner/outer heater combination. With this configuration, the substrate temperature can be maintained at roughly 320° C. across the entire deposition area. The susceptor heater was the only active heating device in the process chamber.

The results are shown in Table 2. Under the normal configuration (left column of Table 2), there exists a great degree of temperature non-uniformity in the process chamber. For example, shadow frame (TC11) shows the highest reading due to the fact that it has direct contact with the substrate that lies right on top of the susceptor. However, the elbow liner at the chamber corner (TC10) has the lowest temperature reading among all the TCs that are exposed to the plasma. Though the chamber wall temperature readings (TC2 & TC6) are even lower, it is effectively shielded by the liners and thus has no film deposition. The liners, which are made of anodized aluminum, have achieved the designed purpose of raising the surface temperature significantly, i.e., TC1>>TC2, TC5>>TC6.

User different process conditions, there exists a large variation of the temperature changes for different chamber parts. Gas flow is the most critical parameter in inducing the temperature change. $H_2$ gas flow, for example, induces the greatest temperature decrease. Other parameters, such as the pressure and electrode spacing, may also induce temperature changes to different extents.

When 1/8" thick ceramic spacers are inserted between the liners and chamber wall (right column of Table 2), a vacuum gap is created therein and thus the heat conduction is reduced from the temperature non-uniformity in the process chamber is not as great as that shown in the left column. Thus using ceramic spacers can create some temperature uniformity in the chamber, although ceramic spacers only achieve limited success in raising the temperature, as identified in TC5 and TC10, with $N_2$ and $H_2$ flow. However, such approach is not quite effective, as the heat loss from the gas flow is much stronger than other heat loss mechanisms. Therefore it would be advantageous to have another active heating device to effectively perform an RTP cleaning of the chamber.

EXAMPLE 2

AKT Fat-belly-liner Chamber

In AKT CVD-5500 alpha (A) chamber, 45-degree liners were changed to Fat-Belly type on all sides except the window side (view limited). Table 3 shows the clean rate comparison between the original and Fat-Belly type 45-degree liners.

TABLE 3

|  | SiH4 (sccm) | Dep. Time (sec) | Dep. Rate (20 mm) | Cln. Time (sec) | Cln. Rate (A/min) |
|---|---|---|---|---|---|
| GH |  |  |  |  |  |
| Orig. Liner | 670 | 180 | 1851 | 48 | 6941 |
| Fat-Belly 45-deg Liners | 670 | 180 | 1813 | 48.7 | 6701 |
| AH |  |  |  |  |  |
| Orig. Liner | 1310 | 60 | 1250 | 13 | 5769 |
| Fat-Belly 45-deg Liners | 1310 | 110 | 1263 | 20 | 6947 |

Dep.: deposition; Cln: clean; GH: high-deposition rate SiNx film; and AH: high-deposition rate amorphous silicon (α-Si) film.

It is shown that Fat-Belly 45-degree liners did achieve faster clean rate in the α-Si cleaning (~20% for AH) case, but in the SiN (GH) case, the clean rate is the same (Table 3). Additionally, Fat-Belly 45-degree liners achieved ~2–3% better deposition uniformity in α-Si and SiN films. The fat-belly liners are modified liners which are in closer proximity to the active heating device (i.e., the susceptor) and have a larger thermal mass compared with the standard liners. Though there were no active heating elements embedded, the potential of raising the chamber part's surface temperature and thus promoting cleaning rate in the AH film cleaning case with the addition of an RTP module is obvious.

In addition, considering that the corners are still the last place to clean, and that the corners are of much lower surface temperature as measured and shown in FIG. 1, it can be concluded that further raising the corner liners' temperatures is the key to promoting the overall cleaning rate. Embedded active heating device in these corner liners may be employed to achieve this goal.

TABLE 2

AKT CVD-5500 Chamber Wall & Liner Temperature Measurement

| | Normal Configuration | | | | | | 1/8" thick ceramic spacer Under liners | | | | | |
|---|---|---|---|---|---|---|---|---|---|---|---|---|
| Process | TC1 | TC2 | TC5 | TC6 | TC10 | TC11 | TC1 | TC2 | TC5 | TC6 | TC10 | TC11 |
| No gas, xchg | 250 | 154 | 240 | 149 | 228 | 279 |  |  |  |  |  |  |
| No gas, 1500 mil | 268 | 156 | 254 | 159 | 244 | 296 | 264 | 147 | 255 | 237? | 225 | 294 |
| 10 slm N2/1.5T/1500 mil | 202 | 141 | 186 | 135 | 156 | 298 | 200 | 119 | 200 | 119 | 171 | 292 |
| 10 slm N2/1.5T/750 mil | 199 | 139 | 183 | 131 | 154 | 296 |  |  |  |  |  |  |
| 4 slm H2/1.2T/1000 mil | 172 | 131 | 159 | 118 | 140 | 293 | 173 | 124 | 170 | 115 | 140 | 294 |
| 4 slm H2/3.0T/1000 mil | 155 | 127 | 145 | 114 | 123 | 298 |  |  |  |  |  |  |
| 12 slm N2/TVO(580 mT)/1600 mil | 196 | 140 | 184 | 130 | 152 | 283 |  |  |  |  |  |  |

(Tsusc = 350/360° C., unit: ° C.)

EXAMPLE 3
Rapid Thermal Process

In AKT PECVD systems, a significant amount of cleaning time is spent cleaning the chamber peripheral parts, such as liners which have the lower surface temperatures due to the close proximity to the wall. The rapid heating module can be a high power lamp placed at the bottom of the chamber, or a resistive heater embedded in the wall next to the liner, or a combination of both. It is contemplated that an inductive heater may also be embedded in the wall next to the liner and may be used singly or in combination with the high power lamp and/or the resistive heater.

When the module heats up, liners and other chamber parts experience a higher surface temperature, which facilitates faster cleaning of the film residues. As was shown in Table 1, a higher surface temperature results in a higher dry etch rate; by extension, further raising the surface temperature of the chamber parts through the action of an RTP module will increase the cleaning rate.

Once the cleaning is effectively done, the rapid heating module is turned off and, due to the effective heat conduction to the huge thermal mass of the chamber body wall, the chamber parts' temperatures quickly return to the equilibrated process temperature. As this process can coincide with the film seasoning period, no throughput loss occurs. During the film deposition period, all chamber parts remain at the normal temperature to provide the optimized substrate temperature.

Figure 2:
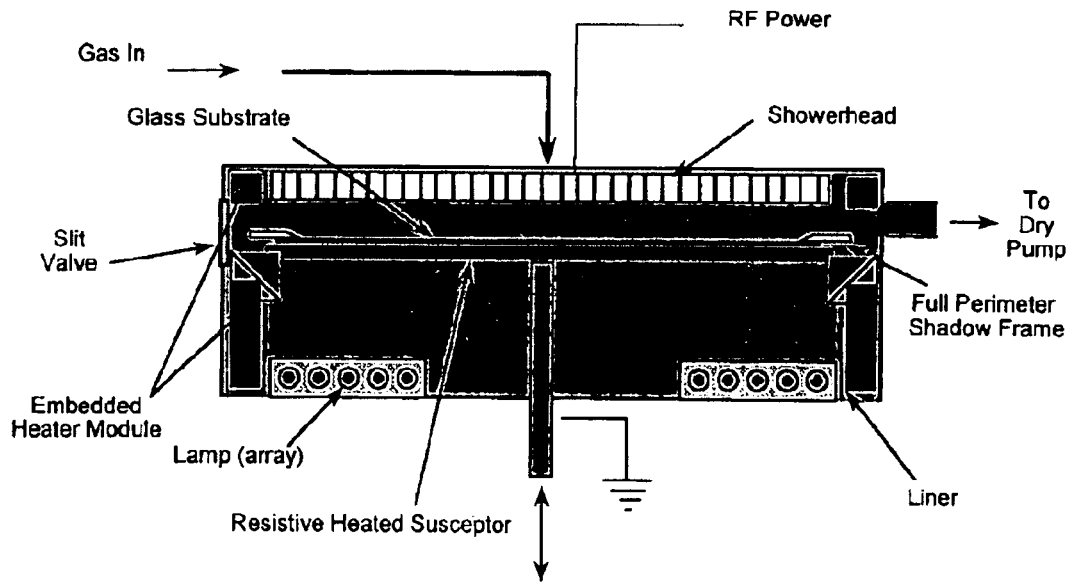
FIG. 2 shows a schematic drawing of a rapid thermal process (RTP) module installed in a process chamber. The RTP module can be a resistive heater assembly, a high-power lamp array, or a combination of both.

Specifically, during the cleaning period, a cleaning gas is flowed to the chamber (FIG. 2). A fluorine-containing gas, a chlorine-containing gas or a halogen-containing gas may be used as the cleaning gas. For example, a fluorine-containing gas, e.g., HF, $F_2$, $NF_3$, $SF_6$, $C_2F_6$, $CF_4$, and $C_3F_8$, or other fluorocarbon gases of the general formula $C_x F_y$ is commonly used for cleaning. A rapid heating module, e.g., a high power lamp placed at the bottom of the chamber, or a resistive heater embedded in the wall next to the liner, or a combination of both, is applied to the chamber to heat up the liners and other chamber pans.

EXAMPLE 4
Rapid Thermal Process Combined with Other Cleaning Process

The rapid thermal process may be applied together with either in-situ plasma cleaning process, or the remote plasma source cleaning (RPSC) process during the cleaning period. In in-situ plasma cleaning systems, precursor gases are supplied to the chamber. Then, by locally applying a glow discharge plasma to the precursor gases within the chamber, reactive species are generated. The reactive species clean the chamber surfaces by forming volatile compounds with the process residues on those surfaces. A rapid heating module, e.g., a high power lamp placed at the bottom of the chamber, or a resistive heater embedded in the wall next to the liner, or a combination of both, is applied to the chamber to heat up the liners and other chamber parts.

Figure 3:
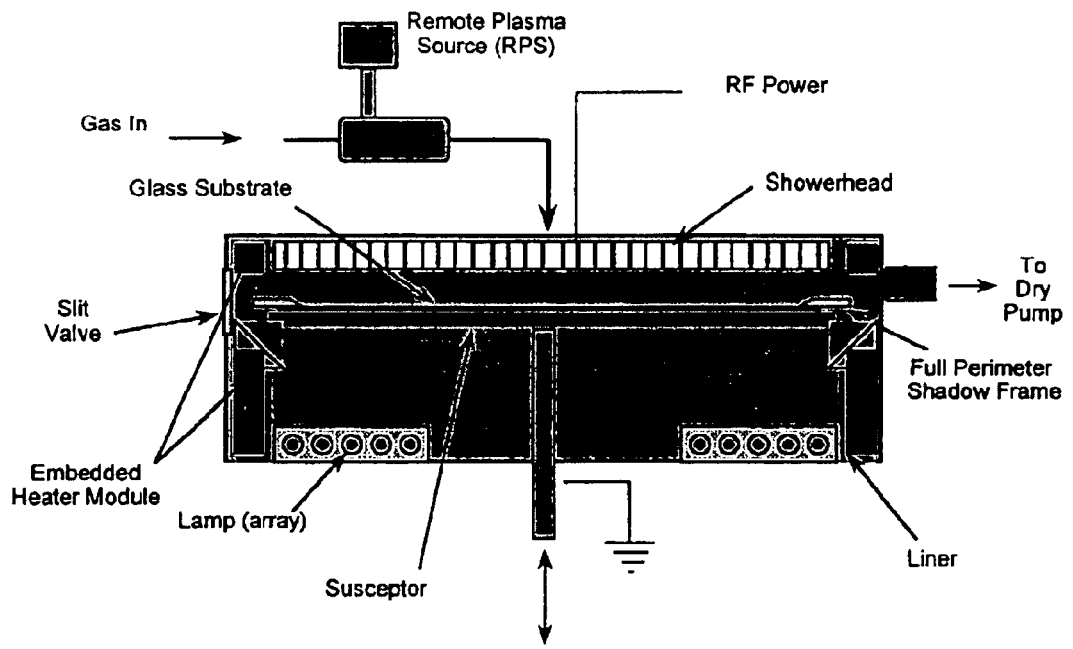
FIG. 3 shows a schematic drawing of a rapid thermal process (RTP) module installed in a process chamber, wherein remote plasma source cleaning (RPSC) is employed to assist the cleaning. The RTP module can be a resistive heater assembly, a high-power lamp array, or a combination of both.

Alternatively, the plasma may be provided remotely (FIG. 3). A remote plasma source cleaning system comprises a cleaning gas source connected to a remote activation chamber. The cleaning gas source includes a source of a precursor gas, an electronically-operated valve and flow control mechanism for controlling the flow of precursor gas and a conduit for flowing the gas into the remote activation chamber located outside and at a distance from the process chamber. A power activation source, for example a high-power microwave generator, is used to activate the precursor gas within the remote activation chamber. The remote chamber may be a sapphire tube and the power source a 2.54 GHz microwave energy source with its output aimed at the sapphire tube. The precursor gas may be a fluorine-containing gas, a chlorine-containing gas or a halogen-containing gas, for example, $NF_3$. The flow rate of activated species is about 2 liters per minute and the process chamber pressure is about 0.5 Torr.

To activate the precursor gas, the microwave source delivers about 3,000–12,000 Watts to the remote activation chamber. A value of 5,000 Watts may be used for many applications. Upon activation, reactive species are generated in the remote chamber, and these reactive species (e.g. F radicals) are flowed into the process chamber wherein cleaning of the chamber occurs as in an in-situ plasma cleaning process.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method for cleaning a process chamber, comprising:
   introducing at least one halogen-containing gas to the process chamber;
   applying a plasma to the halogen-containing gas in the process chamber, wherein the plasma activates the halogen-containing gas to generate reactive species; and
   heating the process chamber with a rapid heating module located in the process chamber, wherein the rapid heating module comprises a high power lamp assembly placed at the bottom of the process chamber and a resistive heater assembly, an inductive heater assembly, or a combination thereof embedded in the chamber wall, wherein the rapid heating module increases the temperature of chamber parts and improves the surface temperature uniformity of chamber parts when the module is turned on, thereby assisting the cleaning activity of the reactive species such that the process chamber is cleaned.

2. The method of claim 1, wherein the reactive species are generated from a fluorine-containing gas or a chlorine-containing gas.

3. The method of claim 2, wherein the fluorine-containing gas is selected from the group consisting of HF $F_2$, $NF_3$, $SF_6$, $C_2F_6$, $CF_4$, and $C_3F_8$.

4. The method of claim 1, wherein the process chamber further comprises liners disposed in the process chamber adjacent the chamber walls.

5. The method of claim 4, wherein the resistive heater assembly is embedded in the chamber wall next to the liners.

6. The method of claim 4, wherein the inductive heater assembly is embedded in the chamber wall next to the liners.

7. The method of claim 1, wherein the process chamber is a chemical vapor deposition chamber or an etch chamber.

8. A method for cleaning a process chamber, comprising:
   introducing at least one fluorine-containing gas to the process chamber;
   applying a plasma to the fluorine-containing gas in the process chamber, wherein the plasma activates the fluorine-containing gas to generate reactive species; and heating the process chamber with a rapid heating module located in the process chamber, wherein the rapid heating module comprises a high power lamp assembly placed at the bottom of the process chamber and a resistive heater assembly, an inductive heater assembly, or a combination thereof embedded in the chamber wall adjacent liners, wherein the rapid heating module increases the temperature of chamber parts and improves the surface temperature uniformity of chamber parts when the module is turned on, thereby assisting the cleaning activity of the reactive species such that the process chamber is cleaned.

9. The method of claim 8, wherein the fluorine-containing precursor gas is selected from the group consisting of HF, $F_2$, $NF_3$, $SF_6$, $C_2F_6$, $CF_4$, and $C_3F_8$.

10. The method of claim 8, wherein the process chamber is a chemical vapor deposition chamber or an etch chamber.

11. A method for cleaning a process chamber, comprising:
introducing at least one halogen-containing gas to a remote chamber, wherein the remote chamber is connected to the interior of the process chamber;
applying a plasma to the halogen-containing gas in the remote chamber wherein the plasma activates the halogen-containing gas to generate reactive species;
introducing the reactive species to the process chamber; and
heating the process chamber with a rapid heating module located in the process chamber, wherein the rapid heating module comprises a high power lamp assembly placed at the bottom of the process chamber and a resistive heater assembly, an inductive heater assembly, or a combination thereof embedded in the chamber wall, wherein the rapid heating module increases the temperature of chamber parts and improves the surface temperature uniformity of chamber parts when the module is turned on, thereby assisting the cleaning activity of the reactive species such that the process chamber is cleaned.

12. The method of claim 11, wherein the reactive species is generated from a fluorine-containing gas or a chlorine-containing gas.

13. The method of claim 12, wherein the fluorine-containing gas is selected from the group consisting of HF, $F_2$, $NF_3$, $SF_6$, $C_2F_6$, $CF_4$, and $C_3F_8$.

14. The method of claim 11, wherein the process chamber further comprises liners disposed in the process chamber adjacent the chamber walls.

15. The method of claim 14, wherein the resistive heater assembly is embedded in the chamber wall next to the liners.

16. The method of claim 14, wherein the inductive heater assembly is embedded in the chamber wall next to the liners.

17. The method of claim 11, wherein the process chamber is a chemical vapor deposition chamber or an etch chamber.

18. A method for cleaning a process chamber, comprising:
introducing at least one fluorine-containing gas to a remote chamber, wherein the remote chamber is connected to the interior of the process chamber;
applying a plasma to the fluorine-containing gas in the remote chamber wherein the plasma activates the fluorine-containing gas to generate reactive species;
introducing the reactive species to the process chamber; and
heating the process chamber with a rapid heating module located in the process chamber, wherein the rapid heating module comprises a high power lamp assembly placed at the bottom of the process chamber and a resistive heater assembly, an inductive heater assembly, or a combination thereof embedded in the chamber wall adjacent liners, wherein the rapid heating module increases the temperature of chamber parts and improves the surface temperature uniformity of chamber parts when the module is turned on, thereby assisting the cleaning activity of the reactive species such that the process chamber is cleaned.

19. The method of claim 18, wherein the fluorine-containing gas is selected from the group consisting of HF, $F_2$, $NF_3$, $SF_6$, $C_2F_6$, $CF_4$, and $C_3F_8$.

20. The method of claim 18, wherein the process chamber is a chemical vapor deposition chamber or an etch chamber.

* * * * *

UNITED STATES PATENT AND TRADEMARK OFFICE
CERTIFICATE OF CORRECTION

PATENT NO. : 6,810,886 B2
DATED : November 2, 2004
INVENTOR(S) : Sheng Sun

It is certified that error appears in the above-identified patent and that said Letters Patent is hereby corrected as shown below:

Column 11,
Line 39, change "pans" to -- parts --.

Signed and Sealed this

Ninth Day of August, 2005

JON W. DUDAS
*Director of the United States Patent and Trademark Office*